US009046410B2

(12) United States Patent
Camargo

(10) Patent No.: US 9,046,410 B2
(45) Date of Patent: Jun. 2, 2015

(54) LIGHT RECEIVING DEVICE

(71) Applicant: Asahi Kasei Microdevices Corporation, Tokyo (JP)

(72) Inventor: Edson Gomes Camargo, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/373,711

(22) PCT Filed: Mar. 28, 2013

(86) PCT No.: PCT/JP2013/002135
§ 371 (c)(1),
(2) Date: Jul. 22, 2014

(87) PCT Pub. No.: WO2013/145757
PCT Pub. Date: Oct. 3, 2013

(65) Prior Publication Data
US 2015/0028216 A1   Jan. 29, 2015

(30) Foreign Application Priority Data

Mar. 29, 2012  (JP) ................................ 2012-077415
Mar. 30, 2012  (JP) ................................ 2012-080573
Mar. 30, 2012  (JP) ................................ 2012-081576

(51) Int. Cl.
*H01L 31/00* (2006.01)
*G01J 5/00* (2006.01)
(Continued)

(52) U.S. Cl.
CPC ............... *G01J 5/0025* (2013.01); *G01B 11/14* (2013.01); *G01J 5/10* (2013.01); *H01L 31/022408* (2013.01); *H01L 31/02005* (2013.01)

(58) Field of Classification Search
CPC ............. G01J 5/20; G01J 5/02; G01J 1/4228; H01L 31/03046; H01L 31/101; H01L 31/1844; H04N 5/33
USPC .......................................................... 250/349
See application file for complete search history.

(56) References Cited

U.S. PATENT DOCUMENTS 5,376,782 A     12/1994 Ikeda et al.
7,768,048 B2 *  8/2010 Ueno et al. .................... 257/293
(Continued)

FOREIGN PATENT DOCUMENTS

ES    2 171 097     8/2002
JP    58-27004      2/1983
(Continued)

OTHER PUBLICATIONS

International Search Report issued in corresponding International Patent Application No. PCT/JP2013/002135 dated May 21, 2013.
(Continued)

*Primary Examiner* — Marcus Taningco
(74) *Attorney, Agent, or Firm* — Morgan, Lewis & Bockius LLP

(57) ABSTRACT

The light receiving device of the present invention includes a circuit pattern including first and second light receiving parts and first and second output terminals, each of the first and second light receiving parts having a semiconductor layered part forming a photodiode structure having first and second conductivity type semiconductor layers, and first and second electrodes respectively connected to the first conductivity type semiconductor layer and the second conductivity type semiconductor layer, wherein the first electrodes of the first and second light receiving parts are connected to each other, the second electrode of the first light receiving part is connected to the first output terminal, the second electrode of the second light receiving part is connected to the second output terminal, and a difference between signals generated in the first and second light receiving parts are output between the first and second output terminals.

9 Claims, 13 Drawing Sheets

(51) Int. Cl.
*G01B 11/14* (2006.01)
*G01J 5/10* (2006.01)
*H01L 31/0224* (2006.01)
*H01L 31/02* (2006.01)

(56) References Cited

U.S. PATENT DOCUMENTS

| | | | |
|---|---|---|---|
| 2002/0145776 A1* | 10/2002 | Chow et al. | 359/124 |
| 2005/0012113 A1* | 1/2005 | Sheu et al. | 257/184 |
| 2007/0090337 A1 | 4/2007 | Ueno et al. | |
| 2007/0229688 A1 | 10/2007 | Apard et al. | |

FOREIGN PATENT DOCUMENTS

| | | |
|---|---|---|
| JP | 63-040347 A | 2/1988 |
| JP | H05-326912 A | 12/1993 |
| JP | 2004-364241 A | 12/2004 |
| JP | 2007-067331 A | 3/2007 |
| JP | 2007-508763 A | 4/2007 |
| JP | 2009-244282 A | 10/2009 |
| WO | 2005/027228 A1 | 3/2005 |

OTHER PUBLICATIONS

Japanese Office Action issued Mar. 24, 2015 in corresponding Japanese Application No. 2012-077415.

Quero et al.; Tracking Control System Using an Incident Radiation Angle Microsensor, IEEE Transactions on Industrial Electronics, vol. 54, No. 2, Apr. 2007, pp. 1207-1216.

Aracil et al.; Tracking System for Solar Power Plants, IEEE Industrial Electronics, 32nd Annual Conference on IEEE, Nov. 1, 2006, pp. 3024-3029.

European Patent Office Communication dated Feb. 25, 2015, for related EP Application No. 13 768 201.9-1504, five (5) pages.

European Patent Office Communication dated Feb. 17, 2015, for related EP Application No. 13 768 201.9-1504, three (3) pages.

\* cited by examiner

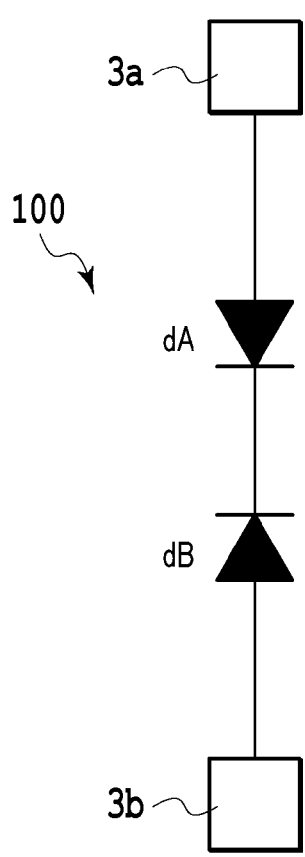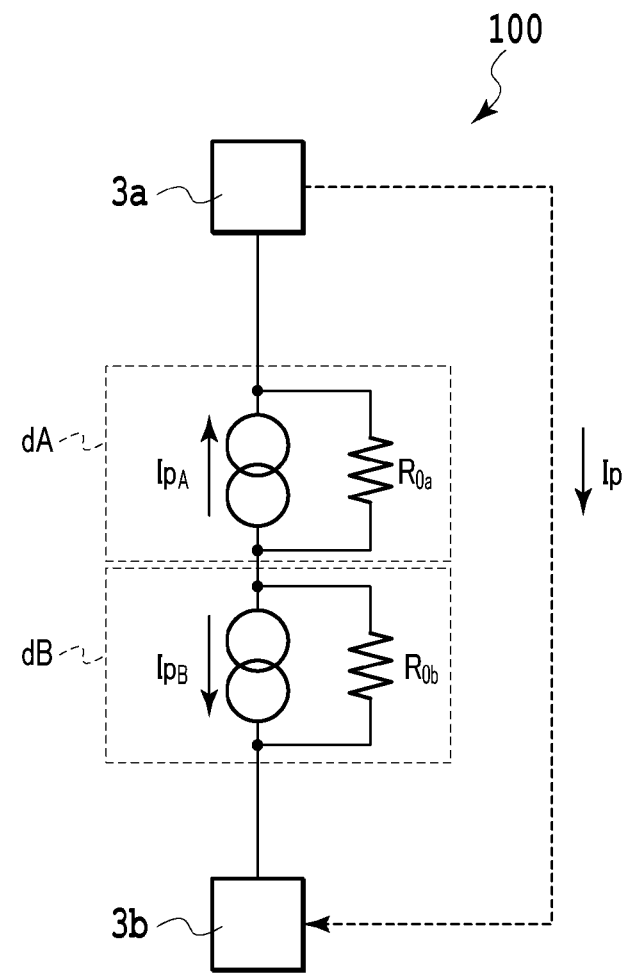
FIG.4A  FIG.4B

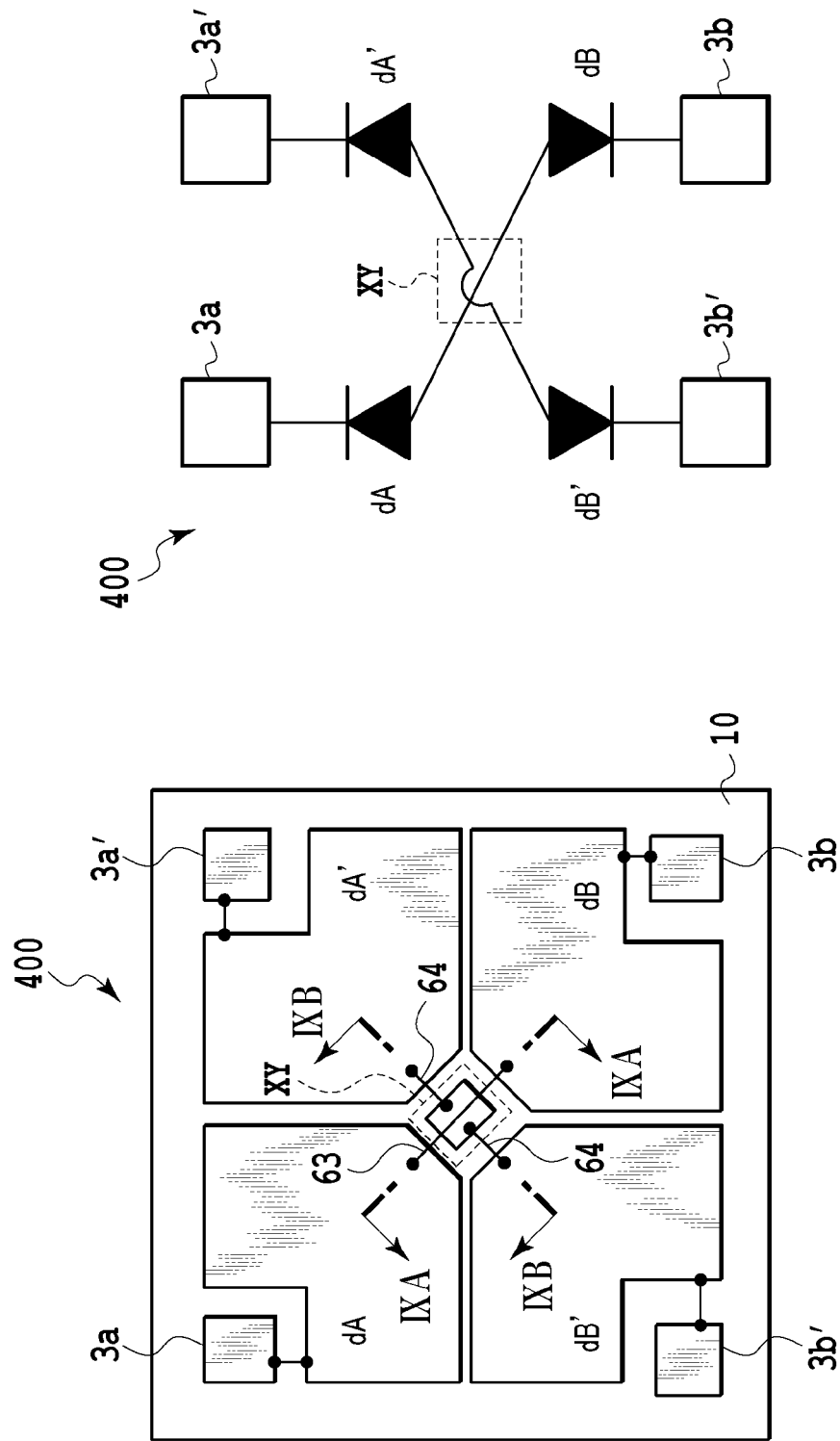

LIGHT RECEIVING DEVICE

TECHNICAL FIELD

The present invention relates to a light receiving device. In more detail, the present invention relates to a light receiving device provided with a plurality of light receiving parts.

BACKGROUND ART

A human body has a body temperature around 36° C. and the human body emits infrared light having a wide range spectrum of 2 to 30 μm in radiation emitted from skin. By detecting this light, it is possible to detect a position or motion of a human body.

Sensors operating in the above wavelength band of 2 to 30 μm include a pyroelectric sensor and a thermopile. In order to realize a high sensitivity in these sensors, it is necessary to provide a hollow region between a light receiving part and a light incident window, and thereby the sensors are prevented from being made smaller.

For solving the limitation by the hollow structure of the thermopile or the pyroelectric sensor, a quantum-type (photovoltaic-type) infrared sensor is expected. The quantum-type infrared sensor includes a PN junction photodiode structure formed with a junction of an n-type semiconductor in which majority carriers are electrons and a p-type semiconductor in which the majority carriers are holes, or a PIN junction photodiode structure having an intrinsic semiconductor between the p-type semiconductor and the n-type semiconductor. In the quantum-type infrared sensor, an electron-hole pair generated by a photon of the infrared light in a depletion layer existing in the PN junction or the PIN junction is separated spatially along a gradient of a valence band and a conduction band to be accumulated, and as a result the p-type semiconductor is charged positively and the n-type semiconductor is charged negatively to generate an electromotive force in between. This electromotive force is called an open-circuit voltage and can be read out as a voltage by the use of an external resistance (optionally, high input impedance circuit or amplifier) having a resistance value larger than the resistance of the PN junction or the PIN junction or can be read out as a current when short-circuited outside the quantum-type infrared sensor.

A problem when such a quantum-type infrared sensor is used as a human sensor at a room temperature is as follows. That is, a difference between an environmental temperature of human activity and a human body temperature is small and therefore output signal is small, and fluctuated infrared light radiated from the environment is detected by the sensor as noise and thus it is difficult to secure a sufficient S/N ratio. Accordingly, in a typical quantum-type infrared sensor, a light receiving part is cooled from an external temperature to increase the output signal and to increase the S/N ratio. As a representative of this quantum-type infrared sensor, a sensor using InSb as a semiconductor layered part, MCT (Mercury Cadmium Teluride), or the like is used.

In a quantum-type infrared sensor using the above compound semiconductor, as shown in Patent Literature 1, there is proposed a method of disposing semiconductor sensors in a planar state and taking out the output voltages of the sensors in a multi-stage series connection to improve the S/N ratio as a human sensor while realizing a smaller size without cooling.

As an application example of the above light sensor, there is expected to be realized a light receiving device for performing calculation of a light intensity radiated from a target object, or calculation of motion of a target object, or a distance to the sensor. In order to realize such a light receiving device, there is devised a method of using a difference value or a summation value of the outputs from a plurality of light sensors.

By using the difference value of the outputs from a plurality of the outputs, it is possible to detect the light receiving intensity of the light radiated from the target object and the motion of the target object. By using the summation value, it is also possible to detect approaching of human body. Further, by arranging the light sensors in an array and calculating a signal based on light receiving intensities of the light entering the sensors in a subsequent stage calculation circuit, it is possible to obtain a sum or a difference of the output signals from the sensors (refer to Patent Literature 2).

FIG. 13 shows a configuration of a conventional light receiving device calculating the difference value and the sum of the outputs from the outputs of the light sensors. FIG. 13 shows a conventional light receiving device 1300 including a light sensor part 1310 including light receiving parts dA to dD, a current-voltage conversion unit 1320 connected to the light sensor 1310 and including current/voltage (current-voltage) conversion amplifiers 4a to 4d, a differential operation unit 1330 connected to the current-voltage conversion unit 1320 and including a first subtraction circuit 5 and a second subtraction circuit 6, and a summation operation unit 1340 connected to the current-voltage conversion unit 1320 and including addition circuits 9 summing output signals from the current-voltage conversion amplifiers 4a to 4d.

In the light sensor part 1310, one of the terminals of the light receiving parts dA to dD are connected to one of the input terminals of the current-voltage conversion amplifiers 4a to 4d via output terminals 3a1 to 3d1, respectively. The other terminals of the light receiving parts dA to dD are grounded via respective output terminals 3a2 to 3d2. In the current-voltage conversion unit 1320, the other input terminals of the current-voltage amplifiers 4a to 4d are grounded. An output terminal of the current-voltage conversion amplifier 4a is connected to the first subtraction unit 5 and the summation operation unit 1340, an output terminal of the current-voltage conversion amplifier 4b is connected to the second subtraction unit 6 and the summation operation unit 1340, an output terminal of the current-voltage conversion amplifier 4c is connected to the first subtraction unit 5 and the summation operation unit 1340, and an output terminal of the current-voltage conversion amplifier 4d is connected to the second subtraction unit 6 and the summation operation unit 1340. The summation operation unit 1340 sums four signals (outputs of the current-voltage conversion amplifiers 4a to 4d) with the addition circuit 9.

In the light sensor part 1310, the light receiving parts dA to dD receive light radiated from an target object, and output currents according to the intensity of the incident light to the respective current-voltage conversion amplifiers 4a to 4d via the respective output terminals 3a1 to 3d1. In the current-voltage conversion unit 1320, the current-voltage conversion amplifiers 4a to 4d convert the respective input currents into voltages and output the respective voltages to the differential operation unit 1330 and the summation operation unit 1340. In the differential operation unit 1330, the first subtraction circuit 5 calculates a difference between the outputs from the current-voltage conversion amplifiers 4a and 4c and outputs a subtraction signal, and the second subtraction circuit 6 calculates a difference between the outputs from the current-voltage conversion amplifiers 4b and 4d and outputs a subtraction signal. The summation operation unit 1340 outputs a summation operation result of the four signals (outputs of the current-voltage conversion amplifiers 4a to 4d).

CITATION LIST

Patent Literature

PTL 1: International Publication Pamphlet No. 2005-27228
PTL 2: Japanese Patent Laid-Open No. 2004-364241

SUMMARY OF INVENTION

Technical Problem

In the configuration shown in FIG. 13, however, the required number of output terminals (pads) becomes two times the number of light receiving parts for obtaining the outputs from the light receiving parts dA to dD and the size of the apparatus becomes larger. Further, since the impedance of a signal source (equivalent to one light receiving part) is low when viewed from the current-voltage conversion amplifier, there is a problem that, when the internal resistance of the light receiving part is small, equivalent input noise of the current-voltage conversion amplifier is amplified and a noise level increases in the output of the current-voltage conversion amplifier.

Further, in the circuit shown in FIG. 13, in order to obtain the difference value and the summation value of the outputs from a plurality of the light receiving parts while suppressing the noise level, it is necessary to use a switching element. However, when the switching element is used, it becomes also necessary to provide an apparatus to control the switching element, which increases the size and the power consumption of the apparatus.

The present invention has been achieved in view of these problems, and the purpose thereof is to provide a light receiving device which can calculate the difference values of the outputs from the light receiving parts at the same time with a high S/N ratio while suppressing the number of output terminals without using the switching element.

Solution to Problem

A light receiving device described in claim 1 of the present invention includes a circuit pattern including a first light receiving part, a second light receiving part, a first output terminal, and a second output terminal, which are formed on a same substrate, each of the first light receiving part and the second light receiving part having a semiconductor layered part forming a PN or PIN junction photodiode structure having a first conductivity type semiconductor layer and a second conductivity type semiconductor layer, a first electrode connected to the first conductivity type semiconductor layer, and a second electrode connected to the second conductivity type semiconductor layer, wherein the first electrode of the first light receiving part is connected to the first electrode of the second light receiving part, the second electrode of the first light receiving part is connected to the first output terminal, the second electrode of the second light receiving part is connected to the second output terminal, and wherein a difference between signals generated in the first light receiving part and the second light receiving part is output between the first output terminal and the second output terminal.

A light receiving device described in claim 2 of the present invention is the light receiving device according to claim 1 of the present invention, and further includes a third light receiving part, a fourth light receiving part, a third output terminal, and a fourth output terminal, which are formed on the same substrate, each of the third light receiving part and the fourth light receiving part having, a semiconductor layered part forming a PN or PIN junction photodiode structure having a first conductivity type semiconductor layer and a second conductivity type semiconductor layer, a first electrode connected to the first conductivity type semiconductor layer, and a second electrode connected to the second conductivity type semiconductor layer, wherein the second electrode of the third light receiving part and the second electrode of the fourth light receiving part are connected to the first electrodes of the first light receiving part and the second light receiving part, the first electrode of the third light receiving part is connected to the third output terminal, and the first electrode of the fourth light receiving part is connected to the fourth output terminal.

A light receiving device described in claim 3 of the present invention is the light receiving device according to claim 1 or 2 of the present invention, and further includes current-voltage conversion amplifiers connected to the first output terminal and the second output terminal, respectively.

A light receiving device described in claim 4 of the present invention is the light receiving device according to claim 2 of the present invention, and further includes a first subtraction circuit connected to the first output terminal and the second output terminal, a second subtraction circuit connected to the third output terminal and the fourth output terminal, a third subtraction circuit connected to the first output terminal and the third output terminal, a fourth subtraction circuit connected to the second output terminal and the fourth output terminal, and an addition circuit connected to output terminals of the third subtraction circuit and the fourth subtraction circuit.

A light receiving device described in claim 5 of the present invention is the light receiving device according to claim 3 or 4 of the present invention, wherein the output terminals and the subtraction circuits are connected to each other via the current-voltage conversion amplifiers, respectively.

A light receiving device described in claim 6 of the present invention is the light receiving device according to any one of claims 3 to 5 of the present invention, wherein the output terminals and the subtraction circuits are connected to each other without via switching elements, respectively.

A light receiving device described in claim 7 of the present invention is the light receiving device according to claim 1 of the present invention and the light receiving device including the two circuit patterns on the same substrate, and further includes a first interconnection layer connecting the first electrode of the first light receiving part and the first electrode of the second light receiving part in one of the circuit patterns and a second interconnection layer connecting the first electrode of the first light receiving part and the first electrode of the second light receiving part in the other one of the circuit patterns, wherein the first interconnection layer and the second interconnection layer are formed so as to cross each other in a crossing part, a first conductivity type semiconductor layer is formed on the substrate in the crossing part, and, in the crossing part, the first interconnection layer is formed on the first conductivity type semiconductor layer in the crossing part via an insulating layer and the second interconnection layer is connected electrically to the first conductivity type semiconductor layer in the crossing part via a contact hole formed in a part of the insulating layer.

A light receiving device described in claim 8 of the present invention is the light receiving device according to any one of claims 1 to 7 of the present invention, wherein the semiconductor layered part is formed of a material containing indium and/or antimony.

A position detection device described in claim 9 of the present invention includes the light receiving device according to any one of claims 1 to 8 and a viewing angle restrictor controlling an incident direction of light entering the light receiving part of the light receiving device.

Advantageous Effects of Invention

According to the present invention, it is possible to realize a light receiving device which can calculate difference values of outputs from light receiving parts at the same time with a high S/N ratio while suppressing the number of output terminals connected to the light receiving parts without using a switching element.

BRIEF DESCRIPTION OF DRAWINGS

FIG. 4A is an equivalent circuit diagram when each of first and second light receiving parts which includes four light receiving elements connected in series in FIG. 1 is assumed to be one diode;

FIG. 4B is an equivalent circuit diagram showing the diodes shown in FIG. 4A in a circuit;

FIG. 8A is a schematic configuration diagram of a light receiving device according to a fourth embodiment of the present invention;

FIG. 8B is an equivalent circuit diagram of the configuration shown in FIG. 8A;

DESCRIPTION OF EMBODIMENTS

Hereinafter, forms (present embodiments) for carrying out the present invention will be explained. A light receiving device of the present embodiments is a light receiving device including a circuit pattern including a first light receiving part, a second light receiving part, a first output terminal, and a second output terminal, which are formed on a same substrate, each of the first light receiving part and the second light receiving part having a semiconductor layered part forming a PN or PIN junction photodiode structure having a first conductivity type semiconductor layer and a second conductivity type semiconductor layer, a first electrode connected to the first conductivity type semiconductor layer, and a second electrode connected to the second conductivity type semiconductor layer, wherein the first electrode of the first light receiving part is connected to the first electrode of the second light receiving part, the second electrode of the first light receiving part is connected to the first output terminal, the second electrode of the second light receiving part is connected to the second output terminal, and wherein a difference between signals generated in the first light receiving part and the second light receiving part is output between the first output terminal and the second output terminal.

[First Embodiment]

Figure 1:
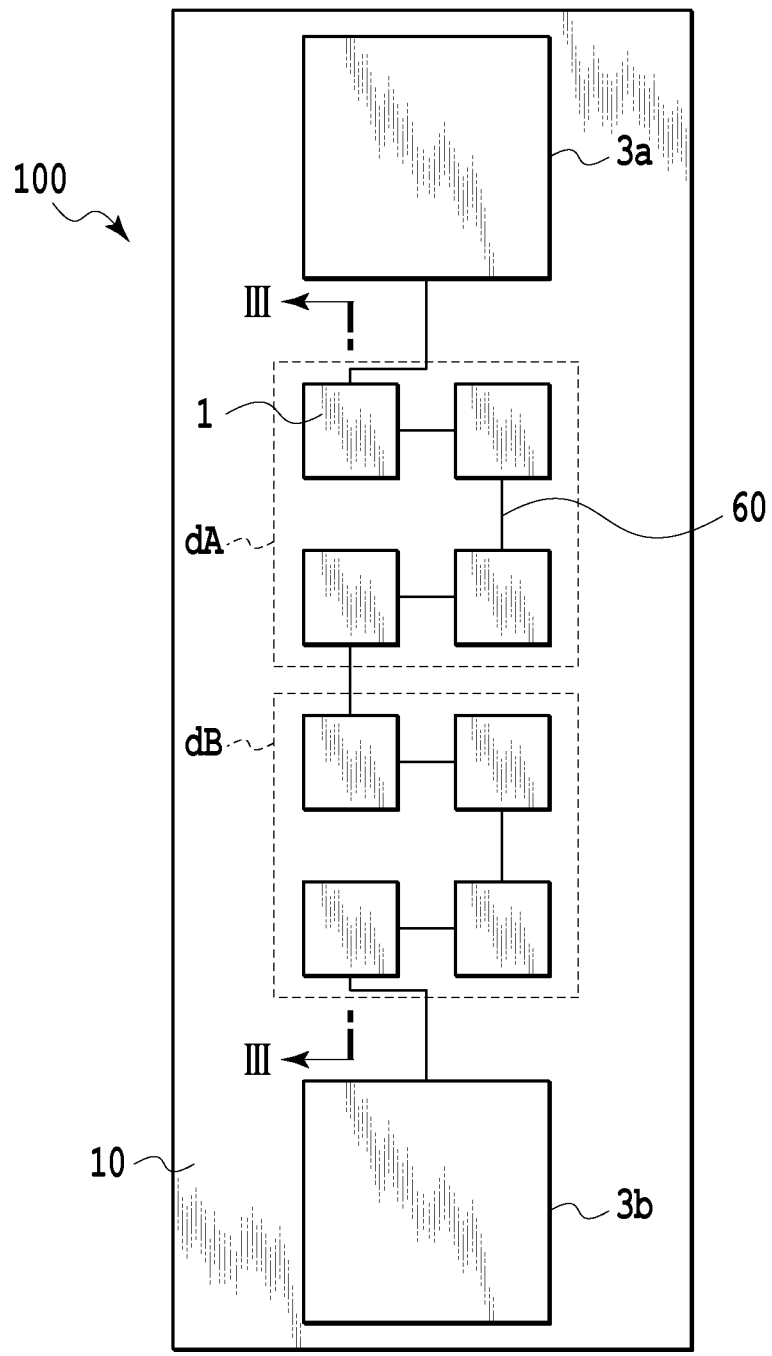
FIG. 1 is a diagram showing a configuration of alight receiving device according to a first embodiment of the present invention.

FIG. 1 shows a configuration of a light receiving device 100 according to a first embodiment of the present invention. The light receiving device 100 shown in FIG. 1 includes first and second light receiving parts dA and dB, and first and second output terminals 3a and 3b on a substrate 10. Each of the first and second light receiving parts dA and dB includes four light receiving elements 1 connected in series via an interconnection layer 60. The first light receiving part dA, the second light receiving part dB, the first output terminal 3a, and the second output terminal 3b are connected in series via the interconnection layer 60.

Figure 2:
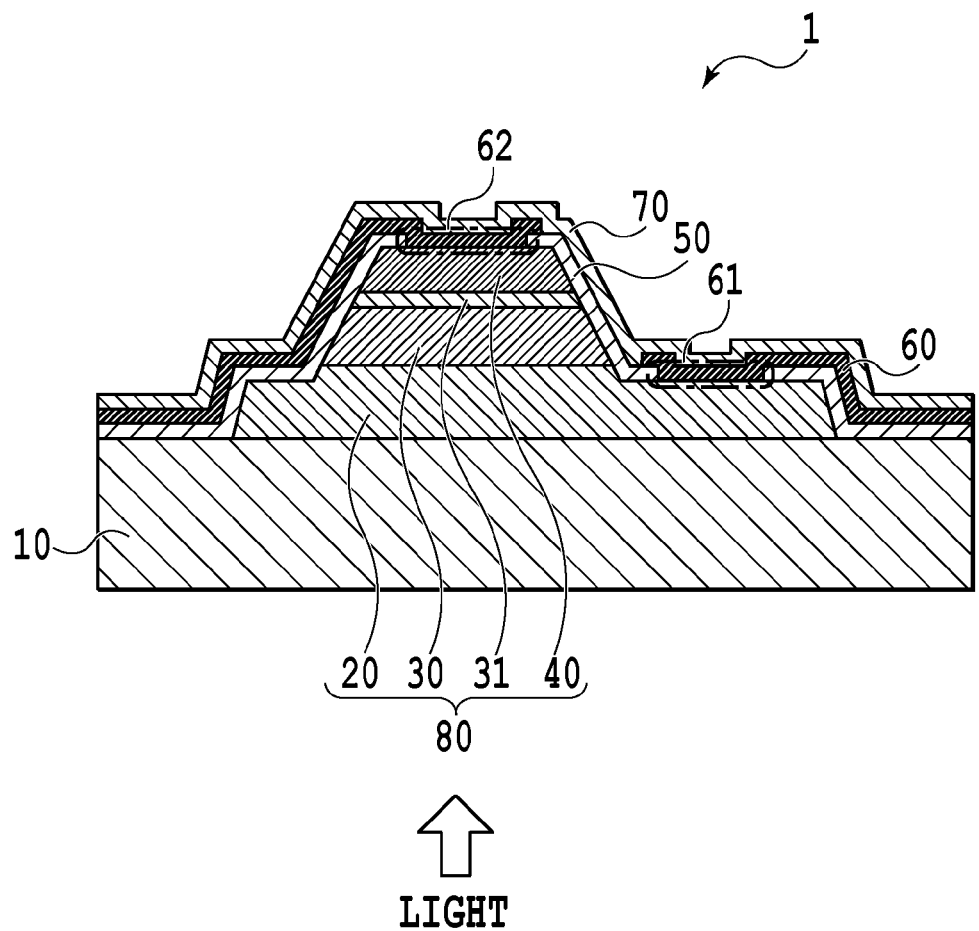
FIG. 2 is a schematic cross-sectional view showing a configuration example of a light receiving element used in first and second light receiving parts according to the present invention.

FIG. 2 is a schematic cross-sectional view showing a configuration example of the light receiving element 1 used in the first and second light receiving parts dA and dB according to the present embodiment. As shown in FIG. 2, the light receiving element 1 includes the substrate 10, a semiconductor layered part 80 formed on the substrate 10, an insulating layer 50 formed on the substrate 10 and the semiconductor layered part 80 so as to cover the semiconductor layered part 80, the interconnection layer 60 formed on the insulating layer 50 and the semiconductor layered part 80, and a protection layer 70 covering the whole surface. The semiconductor layered part 80 includes a PIN junction photodiode structure part having a configuration in which an n-doped n-type semiconductor layer 20, a non-doped or p-doped light absorption layer 30, a barrier layer 31, and a p-doped p-type semiconductor layer 40 are layered sequentially on the substrate 10. A cathode (n-layer electrode) 61 is formed on the n-type semiconductor layer 20, and an anode (p-layer electrode) 62 is formed on the p-type semiconductor layer 40.

Here, the n-type semiconductor layer 20 corresponds to the first conductivity type semiconductor layer in the present invention, and the p-type semiconductor layer corresponds to the second conductivity type semiconductor layer. Note that the present invention is not limited to this case, and the first conductivity type semiconductor may correspond to the p-type semiconductor layer and the second conductivity type semiconductor layer may correspond to the n-type semiconductor layer. This is the same in the following.

Further, the present invention may employ a PN junction photodiode structure in which the light absorption layer 30 is removed from the configuration shown in FIG. 2. Further, the barrier layer 31, the protection layer 70, and the insulating layer 50 are not indispensable constituents in the present invention and can be added optionally depending on requirements.

Materials forming the n-type semiconductor layer 20, the light absorption layer 30, and the p-type semiconductor layer 40 are not limited in particular if the materials can generate photovoltaic power according to incident light. When light to be detected is infrared light, while InSb based material, InGaSb based material, InAlSb based material, InAsSb based material, or material containing In, Sb, Ga, or Al can be used as the materials forming the light absorption layer 30 and the p-type semiconductor layer 40, a detection wavelength band of the device needs to be changed depending on application. In the case of a light receiving element formed of the InSb based material, wavelengths of 1 to 7 μm can be detected. Further, in the case of a light receiving element formed of the InGaSb or InAlSb based material, detection wavelengths can be narrowed down to a wavelength band of 1 to 5 μm. In the case of a light receiving element formed of InAsSb based material, a wavelength band of 1 to 12 μm can be detected. While a photodiode structure by use of an MCT using Hg or Cd is also being studied for detecting the similar wavelength, it is preferable from the viewpoint of environment load reduction that the photodiode structure part including the n-type semiconductor layer 20, the light absorption layer 30, and the p-type semiconductor layer 40 is formed of a material containing In, Sb, Ga, or Al.

While FIG. 2 shows the light receiving element 1 in which light enters the substrate 10 from the rear surface, the present invention may adopt a configuration in which the light enters the substrate 10 from the side where the semiconductor layered part 80 is formed.

In the light receiving element 1 shown in FIG. 2, infrared light of the light to be detected enters the substrate 10 from the surface opposite to the surface on which the semiconductor layered part 80 is layered (in FIG. 2, light travels in the direction from the substrate 10 toward the semiconductor layered part 80). When the infrared light enters the photodiode structure part, an electron-hole pair generated in a depletion layer existing in the photodiode structure part is separated spatially along an electric field gradient between a valence band and a conduction band to be accumulated. As a result, the n-type semiconductor layer 20 is charged negatively and the p-type semiconductor layer 40 is charged positively, and thereby an electromotive force is generated. This electromotive force is called open-circuit voltage, and can be read out as a voltage when connected to a signal processing circuit (amplifier or the like) having a high input impedance, and can be read out also as a current when short-circuited outside the infrared sensor.

When the n-type semiconductor layer 20 is subjected to high-intensity n-type doping, the infrared absorption wavelength of the n-type semiconductor layer 20 is shifted to a shorter wavelength side by an effect called a Burstein-Moss shift. Accordingly, the infrared light having a long wavelength is not absorbed and the infrared light can be transmitted efficiently.

The light absorption layer 30 is a light absorption layer for absorbing the infrared light to generate photocurrent Ip. Accordingly, an area S1 where the n-type semiconductor layer 20 and the light absorption layer 30 contact each other becomes a light receiving area which the infrared light enters. Generally, the photocurrent Ip of the light receiving element 1 becomes larger in proportion to the light receiving area, and therefore it is preferable to increase the area S1 where the n-type semiconductor layer 20 and the light absorption layer 30 contact each other. Further, as the volume of the light absorption layer 30 is larger, an infrared light volume to be absorbed becomes larger, and therefore it is preferable to increase the volume of the light absorption layer 30. The thickness of the light absorption layer 30 is preferably set to be such a thickness so as to be able to diffuse the carriers of electrons and holes generated in the infrared light absorption.

Meanwhile, generally a semiconductor absorbing infrared light as one used in the light absorption layer 30 is a semiconductor having a small band gap, and such a semiconductor has an electron mobility extremely higher than a hole mobility. For example, in the case of InSb, while the electron mobility is approximately 80,000 $cm^2/Vs$, the hole mobility is several hundred $cm^2/Vs$. Accordingly, the element resistance is largely affected by electron flow easiness.

The electrons generated by the infrared absorption in the light absorption layer 30 are diffused by a potential difference formed in the PN or PIN junction photodiode structure part, from the light absorption layer 30 to the side of the n-type semiconductor layer 20 to be taken out as the photocurrent. As described above, since the hole mobility is extremely small in a semiconductor having a small band gap, typically, electric resistance becomes higher in the p-doped layer than the n-doped layer. Further, the electric resistance is increased in inverse proportion to an area where current flows. Accordingly, the element resistance is determined by the size of the area S3 where the light absorption layer 30 and the p-type semiconductor layer 40 contact each other, and it is preferable to reduce the area S3 for increasing the element resistance.

Further, the band gap of a semiconductor which can absorb the infrared light having a wavelength of 5 μm or more is as small as 0.25 eV or less. In such a semiconductor having a small band gap (semiconductor in which a band gap of the material of the light absorption layer 30 is 0.1 to 0.25 eV), it is preferable to form the barrier layer 31 having a band gap larger than the light absorption layer 30 for suppressing electron diffusion current by the electrons on the side of the p-type semiconductor layer 40, because thereby leak current such as dark current of the element becomes small and the element resistance can be increased.

The barrier layer 31 is formed to have a band gap larger than the light absorption layer 30 and the p-type semiconductor layer 40. The material forming the barrier layer 31 includes AlInSb, for example. It is preferable to provide this barrier layer, because thereby the resistance of the light receiving part is increased and, when the signal is amplified in a current-voltage conversion amplifier, a high S/N ratio can be realized.

The insulating layer 50 is formed on the substrate 10 and on the semiconductor layered part 80, and insulates and protects the surfaces of the substrate 10 and the semiconductor layered part 80. The interconnection layer 60 is formed with one layer or multi layers of metal or the like, and is a layer formed on the insulating layer 50 for taking out the photovoltaic power generated in the light absorption layer 30 via the cathode 61 and the anode 62. The upper space of the protection layer 70 may be resin-molded (not shown in the drawing). While the materials of the insulating layer 50 and the protection layer 70 include resin, silicon oxide, silicon nitride, and the like, for example, any insulating material may be used.

The light receiving part may be formed with the single light receiving element 1 and the light receiving part may be formed with a plurality of the light receiving elements 1 connected in series. In a case that each of the light receiving parts dA and dB is formed with the two or more light receiving elements 1, preferably the light receiving elements are connected in series when the photovoltaic power is read out as current. For a case of voltage output, voltage needs to be increased and therefore it is preferable to use the series connection similarly. For the case of current output, when a resistance value and a current value of a signal source are increased, the S/N ratio is improved, and for the case of the voltage output, when the resistance value of the signal source is reduced and the voltage value is increased, the S/N ratio is improved. The configuration how many light receiving elements form the light receiving part in series may be optimized for realizing the optimum S/N ratio, in consideration of a resistance value per PN junction area in the vertical direction (direction vertical to the substrate surface), equivalent input voltage noise in the amplifier, and restrictions in manufacturing (process rule and the like). Obviously, it is preferable to increase the whole size of the light receiving part, because thereby the S/N ratio optimized in the above method is increased. However, the number of pixels and the size of each pixel are to be designed to have values optimized according to an optical system of the system.

Figure 3:
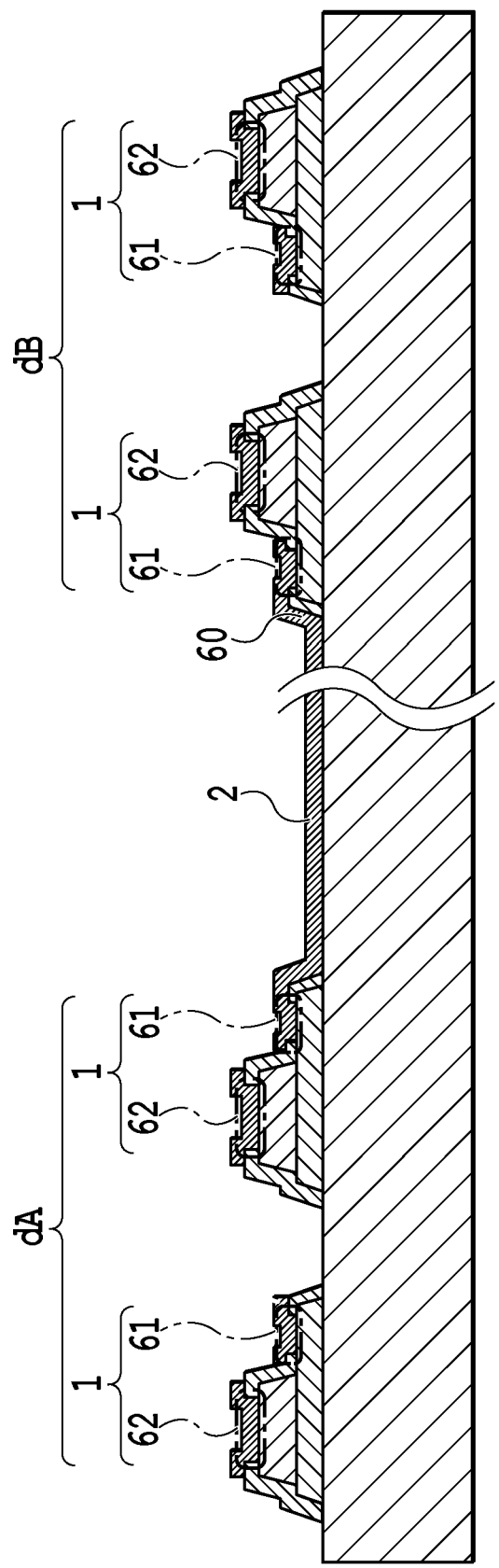
FIG. 3 is a schematic cross-sectional view along a III-III cross sectional line in the light receiving device shown in FIG. 1.

FIG. 3 shows a schematic cross-sectional view of the light receiving device shown in FIG. 1 along the III-III cross-sectional line. The p-layer electrode 62 at the left end of the first light receiving part dA corresponds to the first electrode of the first light receiving part dA and is connected to the first output terminal 3a in FIG. 1 (not shown in FIG. 3). Further, the p-layer electrode 62 at the right end of the second light receiving part dB corresponds to the first electrode of the second light receiving part dB and is connected to the second output terminal 3b in FIG. 1 (not shown in FIG. 3). Further, the n-layer electrode 61 at the right end of the first light receiving part dA corresponds to the second electrode of the first light receiving part dA and the n-layer electrode 61 of the left end of the second light receiving part dB corresponds to the second electrode of the second light receiving part dB, and both of electrodes are connected to each other by the interconnection layer 60. Note that the present invention is not limited to this case, the n-layer electrode may correspond to the first electrode and the p-layer electrode may correspond to the second electrode. This is the same in the following.

FIGS. 4A and 4B show an equivalent circuit of the light receiving device 100 shown in FIG. 1. FIG. 4A is an equivalent circuit diagram when each of the first and second light receiving parts dA and dB which includes the four light receiving elements 1 connected in series in FIG. 1 is assumed to be one diode, and FIG. 4B is an equivalent circuit diagram showing the diode in the circuit.

As described above, in each of the first and second light receiving parts dA and dB, when the light to be detected enters the light absorption layer 30, the electron-hole pair is generated, and, when a bias is not applied from outside, the electrons are diffused to the side of the n-type semiconductor layer 20 and the holes are diffused to the side of the p-type semiconductor layer 40 to generate the currents $Ip_A$ and $Ip_B$ by the photovoltaic power between the n-type semiconductor layer 20 and the p-type semiconductor layer 40.

A signal generated between the first and second output terminals 3a and 3b will be explained in FIG. 4B. While the first and second light receiving parts dA and dB have respective internal resistances $R_{OA}$ and $R_{OB}$, the current Ip flowing between the first and second output terminals 3a and 3b is expressed by following formula (1). Here, $Ip_A$ indicates short-circuit photocurrent generated in the first light receiving part dA connected to the first output terminal 3a, and $Ip_B$ indicates short-circuit photocurrent generated in the second light receiving part dB connected to the second output terminal 3b.

$$Ip=(Ip_A \times R_{OA} - Ip_B \times R_{OB})/(R_{OA}+R_{OB}) \qquad \text{Formula (1)}$$

Further, if the internal resistances $R_{OA}$ and $R_{OB}$ are equal to each other, Ip is expressed by following formula (2).

$$Ip=(Ip_A-Ip_B)/2 \qquad \text{Formula (2)}$$

That is, it is understood that a difference between the signals generated in the first and second light receiving parts dA and dB can be output by the signal between the first and second output terminals 3a and 3b. By the above, it is understood that the light receiving device 100 of the present embodiment can realize a high S/N ratio without via another device (amplifier or another operational element) and without receiving influence of external noise, and can be preferably used for detecting a position and movement of a light source having weak radiation.

By further connecting a current-voltage conversion part to the first and second output terminals 3a and 3b in the light receiving device 100 of the first embodiment, it becomes possible to easily obtain the difference between the signals generated in the first and second light receiving parts dA and dB. While a specific mode of the current-voltage convertor is not restricted in particular, a current-voltage conversion amplifier using an operational amplifier or the like can be used, for example.

A specific example of the amplifier is a transimpedance amplifier. The transimpedance amplifier converts the output current of the output terminal into a voltage signal. When such an amplifier is connected to the output terminals on both sides, the output terminals are virtually shorted by a low impedance of the amplifier, and differential short-circuit current is output as shown in formula (2), Further, the voltage signal proportional to this differential current is obtained at the amplifier output.

While the current obtained from the output terminal is shown here, open-circuit voltage can be taken out when a high input impedance amplifier is utilized. Accordingly, a difference in the respective open-circuit voltages of the first light receiving part dA and the second light receiving part dB is obtained. While the open-circuit voltage may be output depending on application, in many cases, in particular, in the case of the light receiving part formed of a narrow-gap semiconductor (InSb, InAsSb, or the like), preferably the short-circuit current is output as explained above, to avoid the output from easily receive influence of internal resistance temperature dependence of the light receiving part.

[Second Embodiment]

A light receiving device of another form in the present embodiment further includes a third light receiving part, a fourth light receiving part, a third output terminal, and a fourth output terminal, which are formed on the same substrate in the light receiving device according to the first embodiment, and each of the third light receiving part and the fourth light receiving part includes a semiconductor layered part having a first conductivity type semiconductor layer and a second conductivity type semiconductor layer and forming a PN or PIN junction photodiode structure, a first electrode connected to the first conductivity type semiconductor layer, and a second electrode connected to the second conductivity type semiconductor layer, wherein the second electrode of the third light receiving part and the second electrode of the fourth light receiving part are connected to the first electrodes of the first light receiving part and the second light receiving part, the first electrode of the third light receiving part is connected to the third output terminal, and the first electrode of the fourth light receiving part is connected to the fourth output terminal.

Figure 5:
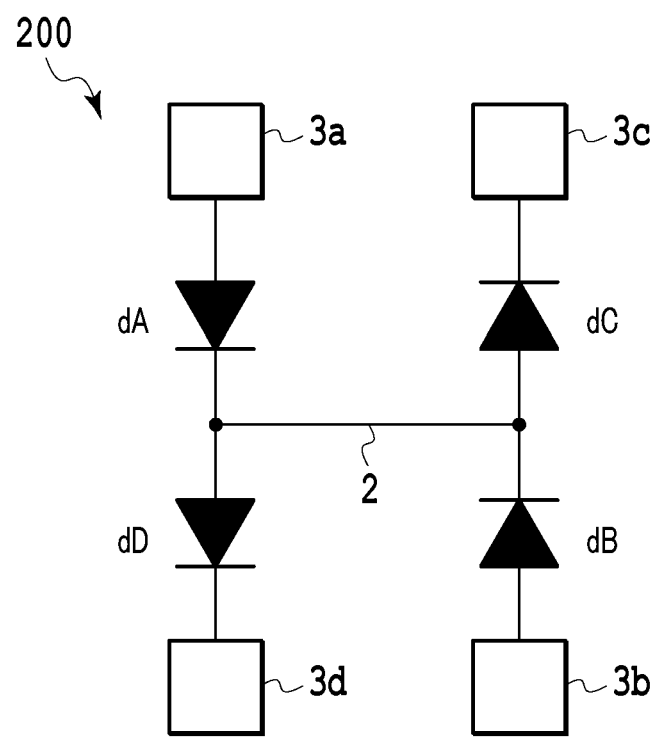
FIG. 5 shows an equivalent circuit of a light receiving device according to a second embodiment of the present invention.

FIG. 5 shows an equivalent circuit of a light receiving device 200 according to the second embodiment of the present invention. The light receiving device 200 shown in FIG. 5 further includes third and fourth light receiving parts dC and dD and third and fourth output terminals 3c and 3d on the same substrate (not shown in the drawing), in addition to the first and second light receiving parts dA and dB and the first and second output terminals 3a and 3b. Each of the first to fourth light receiving parts dA to dD includes the n-layer electrode as the first electrode and the p-type layer electrode as the second electrode.

In the light receiving device 200 shown in FIG. 5, the n-layer electrodes (cathodes) of the first and second light receiving parts dA and dB are connected to each other, the p-layer electrodes (anodes) of the first and second light receiving parts dA and dB are connected respectively to the first and second output terminals 3a and 3b, the p-layer electrodes (anodes) of the third and fourth light receiving parts dC and dD are connected to each other, and the n-layer electrodes (cathodes) of the third and fourth light receiving parts dC and dD are connected respectively to the output terminals 3c and 3d. Further, the n-layer electrodes of the first and second light receiving parts dA and dB and the p-layer electrodes of the third and fourth light receiving parts dC and dD are connected to each other via a common interlayer part 2.

In the light receiving device 200 according to the second embodiment, signals between the output terminals positioned at diagonal positions (between 3a and 3b, and between 3c and 3d) are obtained by following formulas (3) and (4). Signals between the output terminals positioned at upper and lower positions (between 3a and 3d, and between 3b and 3c) are obtained by following formulas (5) and (6). Although explanation by formulas is omitted, signals between the output terminals positioned at right and left positions (between 3a and 3c, and between 3b and 3d) can be obtained in the same manner.

$$Ip_{AB}=(Ip_A-Ip_B)/2 \qquad \text{Formula (3)}$$

$$Ip_{CD}=(Ip_C-Ip_D)/2 \qquad \text{Formula (4)}$$

$$Ip_{AD}=(Ip_A-Ip_D)/2 \qquad \text{Formula (5)}$$

$$Ip_{BC}=(Ip_C-Ip_B)/2 \qquad \text{Formula (6)}$$

Here, $Ip_C$ indicates a short-circuit photocurrent generated in the third light receiving part dC connected to the third output terminal 3c, and $Ip_D$ indicates a short-circuit photocurrent generated in the fourth light receiving part dD connected to the fourth output terminal 3d. $Ip_{AB}$ indicates a short-circuit photocurrent which can be taken out from between the first output terminal 3a and the second output terminal 3b, $Ip_{CD}$ indicates a short-circuit photocurrent which can be taken out from between the third output terminal 3c and the fourth output terminal 3d, $Ip_{AD}$ indicates a short-circuit photocurrent which can be taken out from between the first output terminal 3a and the fourth output terminal 3d, and $Ip_{CB}$ indicates a short-circuit photocurrent which can be taken out from between the third output terminal 3c and the second output terminal 3b.

These short-circuit currents can be taken out by the virtual short of the transimpedance amplifier using the OP amplifier. Further, when the first output terminal 3a and the second output terminal 3b are short-circuited (short circuit point 1) and the third output terminal 3c and the fourth output terminal 3d are short-circuited (short circuit point 2) by the use of switches or the like, and when a short-circuit current $i_{12}$ between the short circuit point 1 and the short circuit point 2 is measured, a total sum of the short-circuit output currents of all the light receiving parts dA to dD can be obtained as shown in following formula (7).

$$I_{12}=(Ip_A+Ip_B+Ip_C+Ip_D)/2 \qquad \text{Formula (7)}$$

As described above, in the light receiving device 200 according to the second embodiment, a differential signal (formula (3)) for the radiation entering the areas of the first light receiving part dA and the second light receiving part dB, and a differential signal (formula (4)) for the radiation entering the areas of the third light receiving part dC and the fourth light receiving part dD can be obtained, and, in addition, the total sum signal (formula (7)) from all the light receiving parts dA to dD can be also obtained. Further, the light receiving device 200 according to the second embodiment has a small number of output terminals and a high utilization efficiency of the substrate, and is sometimes used preferably.

Note that, while the four light receiving parts dA to dD and the four output terminals 3a to 3d are used in the light receiving device 200 according to the second embodiment shown in FIG. 5, the present invention is not limited to this case and a configuration in which the common interconnection part 2 connecting the four light receiving parts includes an output terminal, for example, may be employed.

[Third Embodiment]

Figure 6:
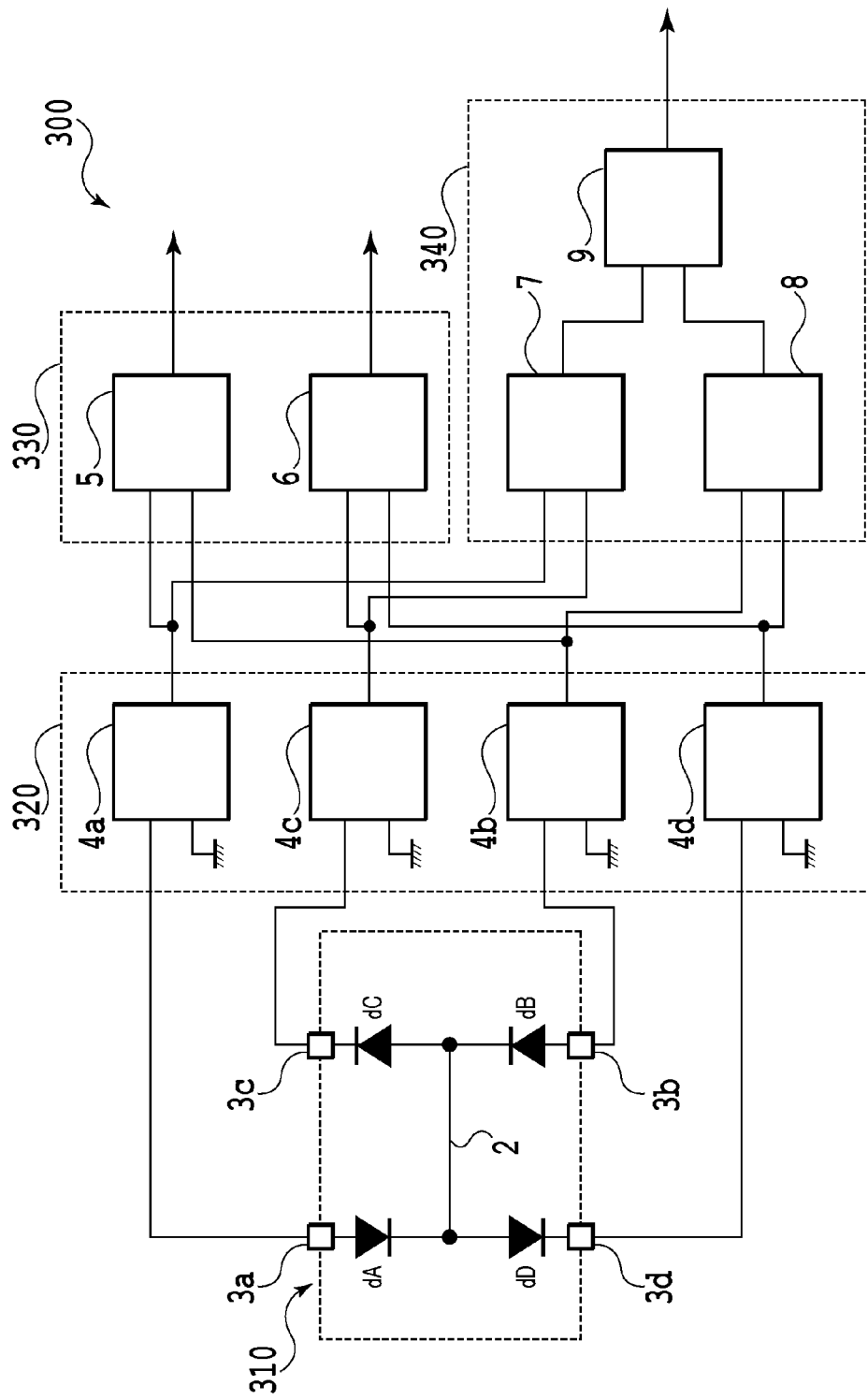
FIG. 6 shows a light receiving device of a third embodiment according to the present invention.

As an application example of the light receiving device 200 according to the second embodiment, a light receiving device 300 according to a third embodiment of the present invention is shown in FIG. 6. FIG. 6 shows the light receiving device 300 provided with a light sensor part 310 including the first to fourth light receiving parts dA to dD, current-voltage conversion unit 320 which is connected to the light sensor 310 and includes first to fourth current-voltage conversion amplifiers 4a to 4d, differential operation unit 330 which is connected to the current-voltage conversion unit 320 and includes a first subtraction circuit 5 and a second subtraction circuit 6, and summation operation unit 340 which is connected to the current-voltage conversion unit 320 and includes a third subtraction circuit 7, a fourth subtraction circuit 8, and an addition circuit 9.

In the light sensor part 310, the second electrodes of the third light receiving part dC and the fourth light receiving part dD are connected to the first electrodes of the first light receiving part dA and the second light receiving part dB, the p-layer electrode of the first light receiving part dA is connected to the first output terminal 3a, the p-layer electrode of the second light receiving part dB is connected to the first output terminal 3b, the first electrode of the third light receiving part dC is connected to the third output terminal 3c, and the first electrode of the fourth light receiving part is connected to the fourth output terminal 3d. In the current-voltage conversion unit 320, the first to fourth current-voltage conversion amplifiers 4a to 4d are connected respectively to the first to fourth output terminals 4a to 4d. Further, the light receiving device 300 according to the third embodiment includes the first subtraction circuit 5 connected to the first and second output terminals 3a and 3b, the second subtraction circuit 6 connected to the third and fourth output terminals 3c and 3d, the third subtraction circuit 7 connected to the first and third output terminals 3a and 3c, the fourth subtraction circuit 8 connected to the second and fourth output terminals 3b and 3d, and the addition circuit 9 connected to output terminals of the third and fourth subtraction circuits. Further, the first to fourth output terminals 3a to 3d and the first to fourth subtraction circuits 5 to 8 are connected to each other respectively via the first to fourth current-voltage conversion amplifiers 4a to 4d.

In the differential operation unit 330, the first subtraction circuit 5 calculates a difference between the respective outputs from the first current-voltage conversion amplifier 4a and the second current-voltage conversion amplifier 4b to output a first subtraction signal, and the second subtraction circuit 6 calculates a difference between the respective outputs from the third current-voltage conversion amplifier 4c and the fourth current-voltage conversion amplifier 4d to output a second subtraction signal. In the summation operation unit 340, the third subtraction circuit 7 calculates a difference of the respective outputs from the first current-voltage conversion amplifier 4a and the third current-voltage conversion amplifier 4c to output a third subtraction signal, the fourth subtraction circuit 8 calculates the respective outputs from the second current-voltage conversion amplifier 4b and the fourth current-voltage conversion amplifier 4d to output a fourth subtraction signal, and the addition circuit 9 calculates a sum of the third subtraction signal and the fourth subtraction signal output respectively from the third subtraction circuit 7 and the fourth subtraction circuit 8 to output a summation signal.

Figure 7:
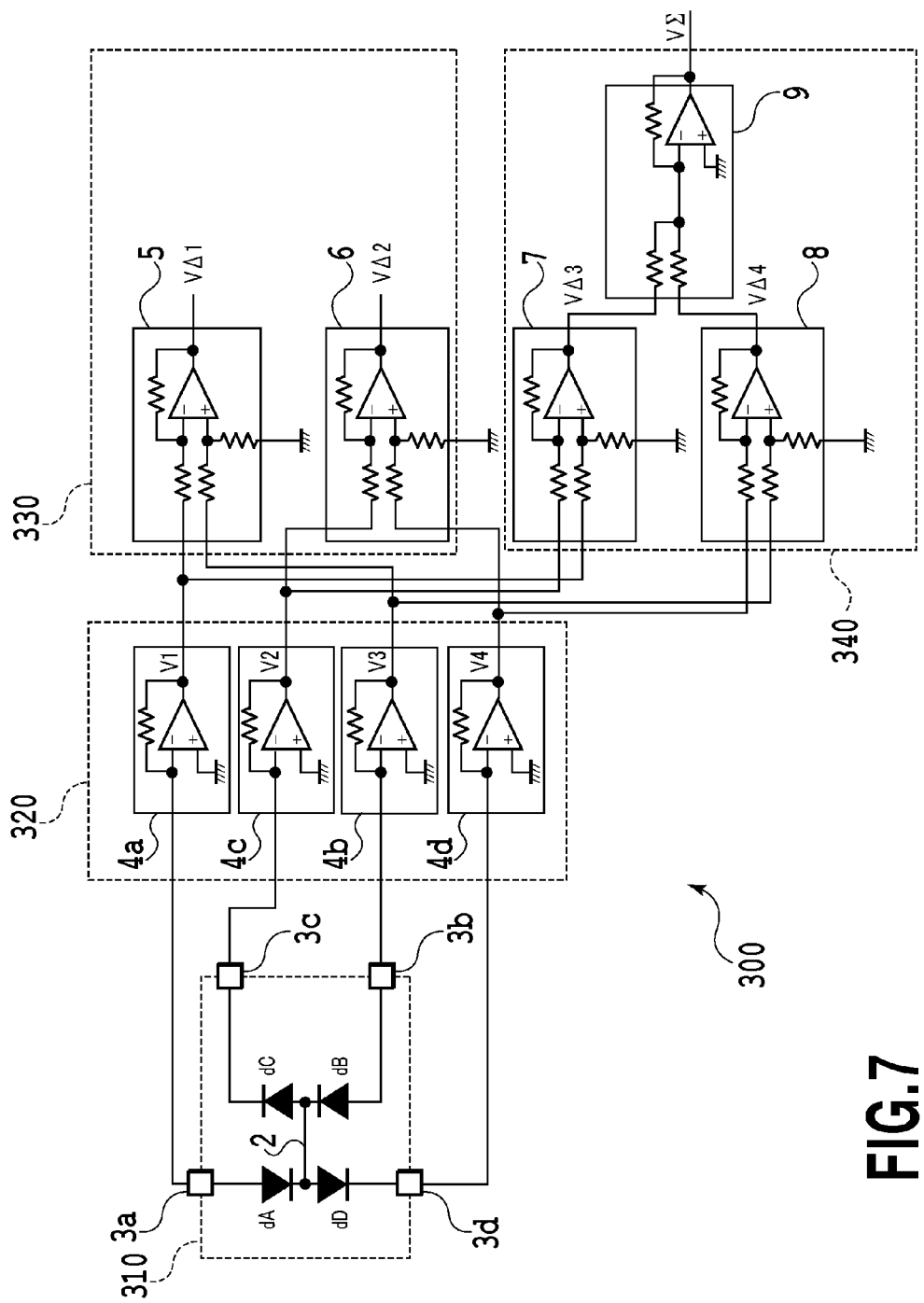
FIG. 7 shows a more specific circuit diagram of current-voltage conversion unit, a subtraction circuit, and an addition circuit in the light receiving device shown in FIG. 6.

FIG. 7 shows a more specific circuit diagram of the current-voltage conversion unit 320, the subtraction circuit 330, and the addition circuit 340 in the light receiving device 300 shown in FIG. 6. The light receiving device 300 according to the third embodiment of the present invention can output the respective differential signals of the outputs in the two pairs of the first light receiving part dA and the second light receiving part dB provided in the diagonal positions and the third light receiving part dC and the fourth light receiving part dD provided in the diagonal positions, and can output the total sum signal of all the light receiving parts dA to dD, at the same time, and therefore the light receiving device 300 is suitable for application to high-speed signal processing.

In the following, a calculation method in the light receiving device 300 according to the third embodiment will be explained. When a conversion resistance of the first to fourth current-voltage conversion amplifiers 4a to 4d is expressed by Rc, respective output signals V1 to V4 of the first to fourth current-voltage conversion amplifiers 4a to 4d are shown as in following formulas (8) to (11).

$$V1 = -Rc[3Ip_{A}/4 - (-Ip_{C} + Ip_{B} - Ip_{D})/4] \quad \text{Formula (8)}$$

$$V2 = -R_{c}[-3Ip_{C}/4 - (Ip_{B} - Ip_{D} + Ip_{A})/4] \quad \text{Formula (9)}$$

$$V3 = -R_{c}[3Ip_{B}/4 - (-Ip_{D} + Ip_{A} - Ip_{C})/4] \quad \text{Formula (10)}$$

$$V4 = -R_{c}[-3Ip_{D}/4 - (Ip_{A} - Ip_{C} + Ip_{B})/4] \quad \text{Formula (11)}$$

Moreover, as shown in FIG. 7, these output signals V1 to V4 are input into the differential operation unit 330 and the summation operation unit 340 which are connected to the output terminals of the first to fourth current-voltage conversion amplifiers 4a to 4d. In the differential operation unit 330, calculation is performed by following formulas (12) and (13), and thereby a first subtraction signal VΔ1 and a second subtraction signal VΔ2 are output from the first subtraction circuit 5 and the second subtraction circuit 6, respectively. Here, k1 to k3 express coefficients determined by Rc and resistance values of resistors used in the first to fourth subtraction circuits 5 to 8 and the addition circuit 9.

$$V\Delta 1 = -k1[V1 - V3] \quad \text{Formula (12)}$$
$$= -k1[3(Ip_{B} - Ip_{A})/4 - (Ip_{A} - Ip_{B})/4]$$
$$= k1(Ip_{A} - Ip_{B})$$

$$V\Delta 2 = -k2[V2 - V4] \quad \text{Formula (13)}$$
$$= -k2[3(-Ip_{D} + Ip_{C})/4 - (-Ip_{C} + Ip_{D})/4]$$
$$= k2(Ip_{D} - Ip_{C})$$

In the summation operation unit 340, calculation is performed by following formula (14) using the third subtraction signal VΔ3=(V1−V2) and the fourth subtraction signal VΔ4=(V3−V4) which are output from the third subtraction circuit 7 and the fourth subtraction circuit 8 respectively, and thereby the summation signal VΣ is output from the addition circuit 9.

$$V\Sigma = -k3[(V1 - V2) + (V3 - V4)] \quad \text{Formula (14)}$$
$$= k3[Ip_{A} + Ip_{C} + Ip_{B} + Ip_{D}]$$

By the above explanation, it is understood from formula (12) to formula (14) that it is possible to realize the light receiving device capable of calculating the differential signals and the summation signal of the output currents from the first to fourth light receiving parts dA to dD, using the small-size light receiving device 300 including the light sensor part 310 which has the same number of output terminals as the number of light receiving parts without using switching elements.

Low noise amplifiers are suitable for the initial stage first to fourth current-voltage conversion amplifiers 4a to 4d. Specifically, it is preferable to use an auto-zero amplifier in which input offset fluctuation is suppressed. In the present invention, if a high S/N ratio is realized in the initial first to fourth current-voltage conversion amplifiers 4a to 4d, it is not necessary to use the auto-zero amplifiers in the subsequent calculators 5 to 9 and typical OP amplifiers may be used. Thereby, a small size integrated circuit can be realized.

[Fourth Embodiment]

Another form of the light receiving device according to the present embodiment is a light receiving device including two circuit patterns, each of which is the circuit pattern in the light receiving device according to the first embodiment, on the same substrate, and further includes a first interconnection layer connecting the first electrode of the first light receiving part and the first electrode of the second light receiving part in one of the circuit patterns, and a second interconnection layer connecting the first electrode of the first light receiving part and the first electrode of the second light receiving part in the other one of the circuit patterns, wherein the first interconnection layer and the second interconnection layer are formed so as to cross each other in a crossing part and the first conductivity type semiconductor layer is formed on the substrate in the crossing part, and, in the crossing part, the first interconnection layer is formed on the first conductivity type semiconductor layer in the crossing part via an insulating layer and the second interconnection layer is connected electrically to the first conductivity type semiconductor layer in the crossing part via a contact hole which is formed at a part of the insulating layer.

FIG. 8A is a schematic configuration diagram of a light receiving device 400 according to the fourth embodiment of the present invention, and FIG. 8B is an equivalent circuit diagram thereof. The light receiving device 400 shown in FIGS. 8A and 8B includes a first circuit pattern including the first and second light receiving parts dA and dB, and the first and second output terminals 3a and 3b, and a second circuit pattern including first and second light receiving parts dA' and dB', and first and second output terminals 3a' and 3b', on the substrate 10. The first and second circuit patterns have the same circuit pattern.

As shown in FIGS. 8A and 8B, a first interconnection layer 63 connecting electrodes of the first light receiving part dA and the second light receiving part dB to each other in the first circuit pattern and a second interconnection layer 64 connecting electrodes of the first light receiving part dA' and the second light receiving part dB' to each other in the second circuit pattern form a crossing part XY in a state insulated electrically from each other.

Figure 9A:
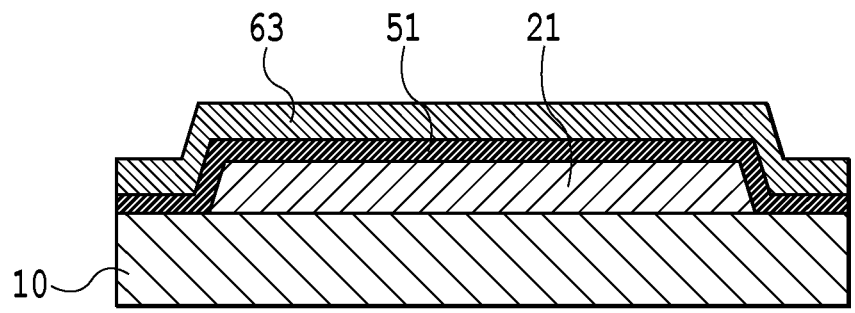
FIG. 9A is a schematic cross-sectional view along a IXA-IXA cross-sectional line in the light receiving device shown in FIG. 8A.
Figure 9B:
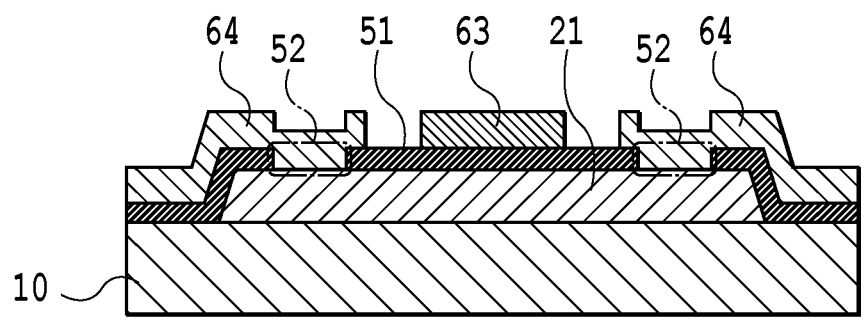
FIG. 9B is a schematic cross-sectional view along a IXB-IXB cross-sectional line in the light receiving device shown in FIG. 8A.

By the use of FIGS. 9A and 9B, a configuration of the crossing part XY will be explained. FIG. 9A is a schematic cross-sectional view along the IXA-IXA cross-sectional line in the light receiving device 400 shown in FIG. 8A, and FIG. 9B is a schematic cross-sectional view along the IXB-IXB cross-sectional line in the light receiving device 400 shown in FIG. 8A. FIG. 9A shows a first conductivity type semiconductor layer 21 formed partially on the substrate 10, an insulating layer 51 formed on the substrate 10 and the first conductivity type semiconductor layer 21, and the first interconnection layer 63 formed on the insulating layer 51. As shown in FIG. 9A, the first interconnection layer 63 is formed on the first conductivity type semiconductor layer 21 via the insulating layer 51 in the crossing part XY.

FIG. 9B shows the first conductivity type semiconductor layer 21 formed partially on the substrate 10, the insulating layer 51 which is formed partially on the first conductivity type semiconductor layer 21 and also formed on the substrate 10, the first interconnection layer 63 formed on the insulating layer 51, and the second interconnection layer 64 formed on the first conductivity type semiconductor layer 21 and on the insulating layer 51. As shown in FIG. 9B, in the crossing part XY, the second interconnection layer 64 is connected to the first conductivity type semiconductor layer 21 via a contact hole 52 which is formed at a part of the insulating layer 51.

When the crossing part XY of the first interconnection layer 63 and the second interconnection layer 64 is configured as shown in FIGS. 9A and 9B, since the first interconnection layer 63 and the second interconnection layer 64 exist in the same layer, compared with a conventional crossing part having a layered structure in which the first and second interconnection layers are formed in different layers via an insulating layer, it is possible to perform the formation of the first interconnection layer 63 and the second interconnection layer 64 through a single process, and it is possible to reduce problems caused by disconnection or the like to obtain an infrared sensor array having a high reliability.

From a viewpoint of easiness in the manufacturing process, preferably the first conductivity type semiconductor layer 21 in the crossing part XY is formed of the same material as the first conductivity type semiconductor layer 20 in the light receiving part. It is also preferable to form the first conductivity type semiconductor layer 21 in the crossing part XY with the same material as that of the first conductivity type semiconductor layer 20 in the light receiving part, because the band structure is degenerated and a lower resistance is realized.

The material for the first interconnection layer 63 and the second interconnection layer 64 is preferably a metal layer from a viewpoint of lower resistance. As a specific example, preferably the first interconnection layer 63 and the second interconnection layer 64 include a material represented by Au or Pt and Al having small resistivity. Further, from a viewpoint of improving adhesion and reducing contact resistance with the first conductivity type semiconductor layer 21, preferably each of the first interconnection layer 63 and the second interconnection layer 64 has a multilayer structure in which Ti is used as the bottom layer (layer contacting the semiconductor).

When an n-type layer is used as the material of the first conductivity type semiconductor layer 21 in the crossing part XY, the sheet resistance of the first conductivity type semiconductor layer 21 in the crossing part XY is preferably not larger than $100\Omega/\square$, more preferably not larger than $50\Omega/\square$, further more preferably not larger than $10\Omega/\square$, and most preferably not larger than $5\Omega/\square$. While the sheet resistance becomes smaller as the n-type layer as the first conductivity type semiconductor layer 21 becomes thicker, too thick n-type layer (not smaller than 1.5 µm or not smaller than 2 µm, for example) is not preferable in the device manufacturing.

When the photocurrent is taken out from the light receiving part, since current take-out efficiency is increased as a series component of the resistance in the first interconnection layer 63 and the second interconnection layer 64 becomes smaller, preferably the resistance of the second interconnection layer 64 in the crossing part XY is smaller than the resistance of the PIN or PN junction part in the light receiving part.

Operation of the light receiving device 400 according to the fourth embodiment will be explained. The light receiving device 400 shown in FIGS. 8A and 8B can output each of a difference between the outputs of the first and second light receiving elements dA and dB which becomes the output from the first circuit pattern and a difference between the outputs of the first and second light receiving elements dA' and dB' which becomes the output from the second circuit pattern. When the internal resistances of all the light receiving parts are equal to one another, the output from the first circuit pattern becomes $Ip_A-Ip_B$, and the output Y from the second circuit pattern becomes $Ip_A'-Ip_B'$.

Here, when the output from the first circuit pattern and the output from the second circuit pattern are added together, the result becomes $(Ip_A+Ip_A')-(Ip_B+Ip_B')$, and a difference between the outputs of the upper light receiving parts (dA and dA') and the lower light receiving parts (dB and dB') in FIG. 8A is obtained.

Further, when the output from the second circuit pattern is subtracted from the output from the second circuit pattern, the result becomes $(Ip_A+Ip_B')-(Ip_A'+Ip_B)$, and a difference between the outputs of the left side light receiving parts (dA and dB') and the right side light receiving parts (dA' and dB) in FIG. 8A is obtained.

That is, it is understood that a difference between the light receiving parts can be obtained continuously only by simple addition and subtraction. It is also understood that the difference between the light receiving parts can be obtained simply and also continuously, although, in the conventional technique, the difference can be obtained only by means of calculating the outputs from the elements discretely using switching circuits or the like.

[Fifth Embodiment]

A position detection device according to a fifth embodiment of the present invention includes the above described light receiving device and a viewing angle restrictor controlling the incident direction of light entering the light receiving part of the light receiving device.

Figure 10:
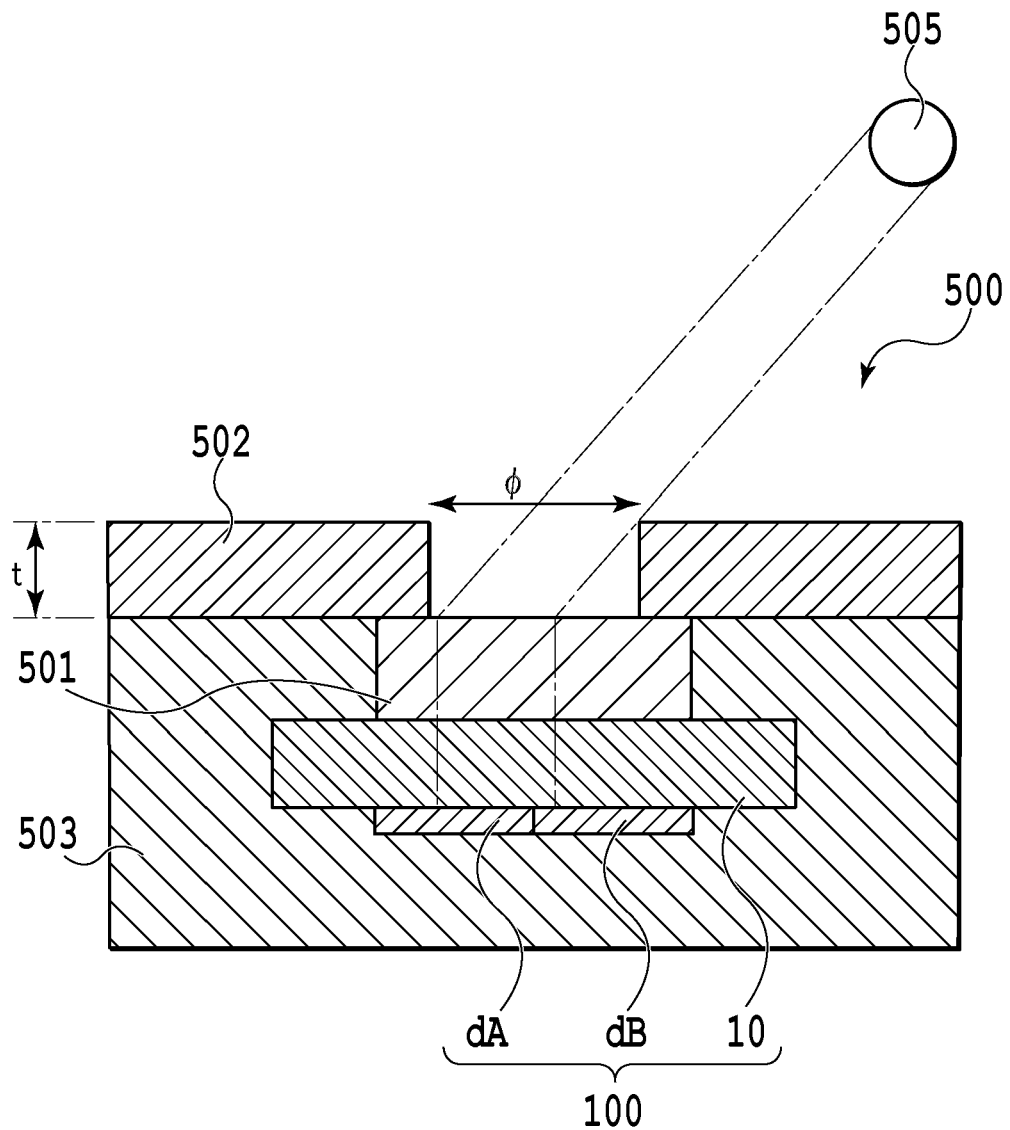
FIG. 10 shows a position detection device according to a fifth embodiment of the present invention using the light receiving device according to the first embodiment.

FIG. 10 shows a position detection device 500 according to the fifth embodiment of the present invention using the light receiving device 100. FIG. 10 is a cross-sectional view of the position detection device 500 using the light receiving device 100 according to the present invention. FIG. 10 shows the position detection device 500 including the light receiving device 100, an optical filter 501 which is disposed on the rear surface of the substrate 10 and restricts the wavelength of light entering the light receiving device 100, a viewing angle restrictor 502 controlling a viewing field of the light receiving part in the light receiving device 100, and a resin mold 503 molding the light receiving device 100 and the optical filter 501. While the light receiving device 500 shown in FIG. 10 further includes the third and fourth light receiving parts dC and dD, in addition to the first and second light receiving parts dA and dB and, for simple explanation, a case of using the first and second light receiving parts dA and dB will be explained as an example as far as not mentioned otherwise in particular.

Infrared light radiated from a light source 505, when entering the position detection device 500, enters the substrate 10 from the rear side via the optical filter 501 of the position detection device 500 while the incident angle is being restricted by the viewing angle restrictor 502, and enters the first and second light receiving parts dA and dB. Since respective intensities of the lights entering the light receiving parts dA and dB are changed by this viewing angle restrictor 502 according to the position of the light source 505, the position of the light source 505 can be detected by means of calculating a difference thereof. In the case of the position of the light source 505 as shown in FIG. 10, since a light flux entering the light receiving part dA is larger than a light flux entering the light receiving part dB, $Ip_A$ becomes larger than $Ip_B$. By obtaining a difference between $Ip_A$ and $Ip_B$, it is possible to obtain one-dimensional position information at what position the light source 505 exists in the viewing angle range, utilizing this mechanism. Further, when the light receiving device 100 further includes another light receiving part in addition to the first and second light receiving parts dA and dB, it becomes also possible to perform two-dimensional position detection using these light receiving parts. Moreover, since the distance between the light receiving parts dA and dB and the light source 505 can be detected by means of obtaining a sum of the outputs from the light receiving parts, it becomes also possible to obtain three-dimensional position information.

While, in the position detection device 500 shown in FIG. 10, a case of using a plate having a hole is illustrated for the viewing angle restrictor 502, an optical lens may be utilized or combined. The optical characteristics of the device are determined based on the diameter ϕ of the viewing angle restrictor 502 and the thickness t of its opening part. The light source 505 to be detected is not limited in particular as far as the light source is a material emitting infrared light having a wavelength within a sensitivity range of the light receiving element in the light receiving device 100.

The optical filter 501 can be provided as needed between the substrate 10 and the viewing angle restrictor 502 when only a part of a wavelength range is desired to be detected. An example of the optical filter 501 is an interference filter having a wavelength selection capability which is obtained by means of laminating a multilayer of two kinds of material having different refractive indexes on a Si substrate. Since the optical filter 501 like this has a refractive index higher than air (n≥3), the incident light has an angle almost perpendicular to the surface of the optical filter 501 and travels up to the first and second light receiving parts dA and dB.

While, in the position detection device 500 shown in FIG. 10, the structure, the viewing angle restrictor 502/the optical filter 501/the substrate 10, is shown, a structure, the optical filter 501/the viewing angle restrictor 502/the substrate 10, may be used depending on restriction in a package structure. Alternatively, a structure, a cap/the viewing angle restrictor 502/the optical filter 501/the substrate 10, may be used. Note that the "cap" here preferably has a sufficiently high transmittance for the wavelength of the light radiated by the light source 505. Further, by the shape of this cap, the viewing angle may become wider or narrower with a refractive effect of light. In this case, it is preferable to utilize a shape suitable for each application.

Figure 11:
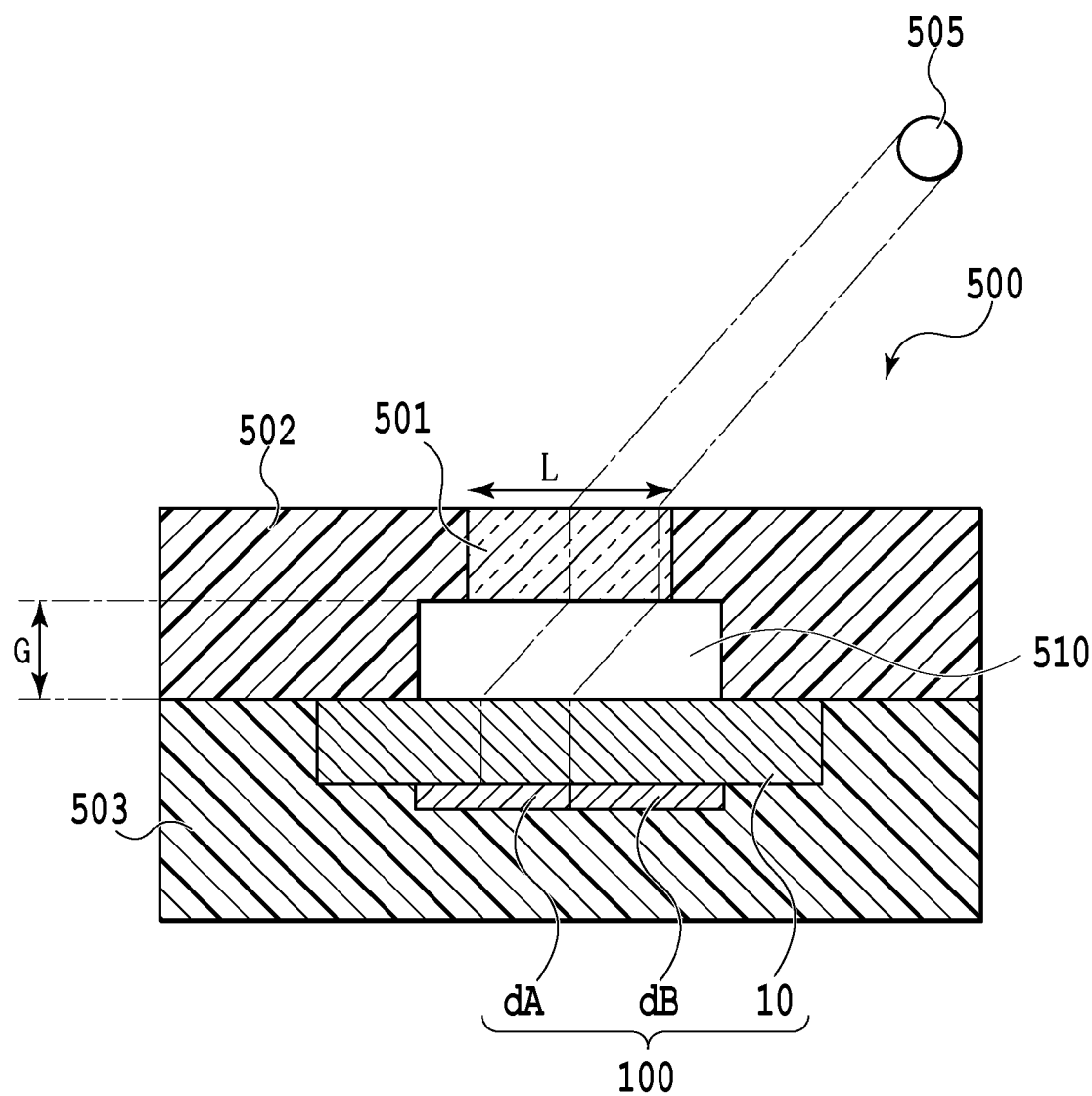
FIG. 11 shows another example of a position detection device according to the fifth embodiment of the present invention using the light receiving device according to the first embodiment.

Moreover, as shown in FIG. 11, a hollow part 510 may be provided between the optical filter 501 and the rear surface of the substrate 10 to form a gap G, and the optical filter 501 and the viewing angle restrictor 502 are configured to have a flat surface. Thereby, a concave part is not formed on the top surface of the package, and sometimes this is preferable because contamination is prevented. In this structure, the size of the gap G and the width L of the optical filter 501 determine the size of detectable viewing field. Further, the inner wall of the hollow part 510 preferably has a low reflectivity for the wavelength of the light to be detected.

The position detection device 500 as shown in FIG. 10 was fabricated, and a light source 505 having a diameter of 15 mm was set at a distance of 20 mm from the sensor surface. For the light receiving device 100 used in the position detection device 500, a GaAs substrate of 0.45 mm square was used as the substrate 10, and the light receiving parts dA and dB in which light receiving elements 1 each including 24 InSb photodiodes are connected in series were used. The thickness t of the opening part in the viewing angle restrictor 502 was set to 0. 5 mm, and the diameter ϕ of the hole was set to 0.5 mm.

Figure 12:
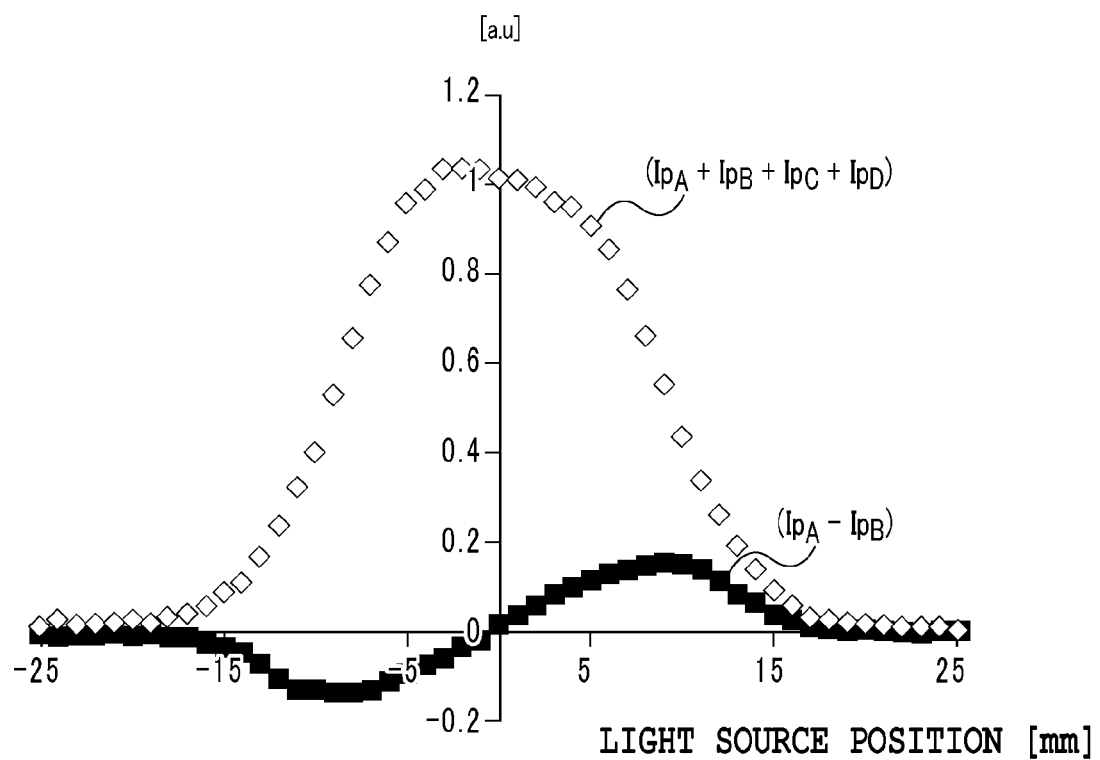
FIG. 12 shows a relationship of a difference between $Ip_A$ $Ip_B$ and a relationship of a total sum of $Ip_A$ to $Ip_D$ with respect to a light source position when a light source is moved against the position detection device according to the fifth embodiment.
Figure 13:
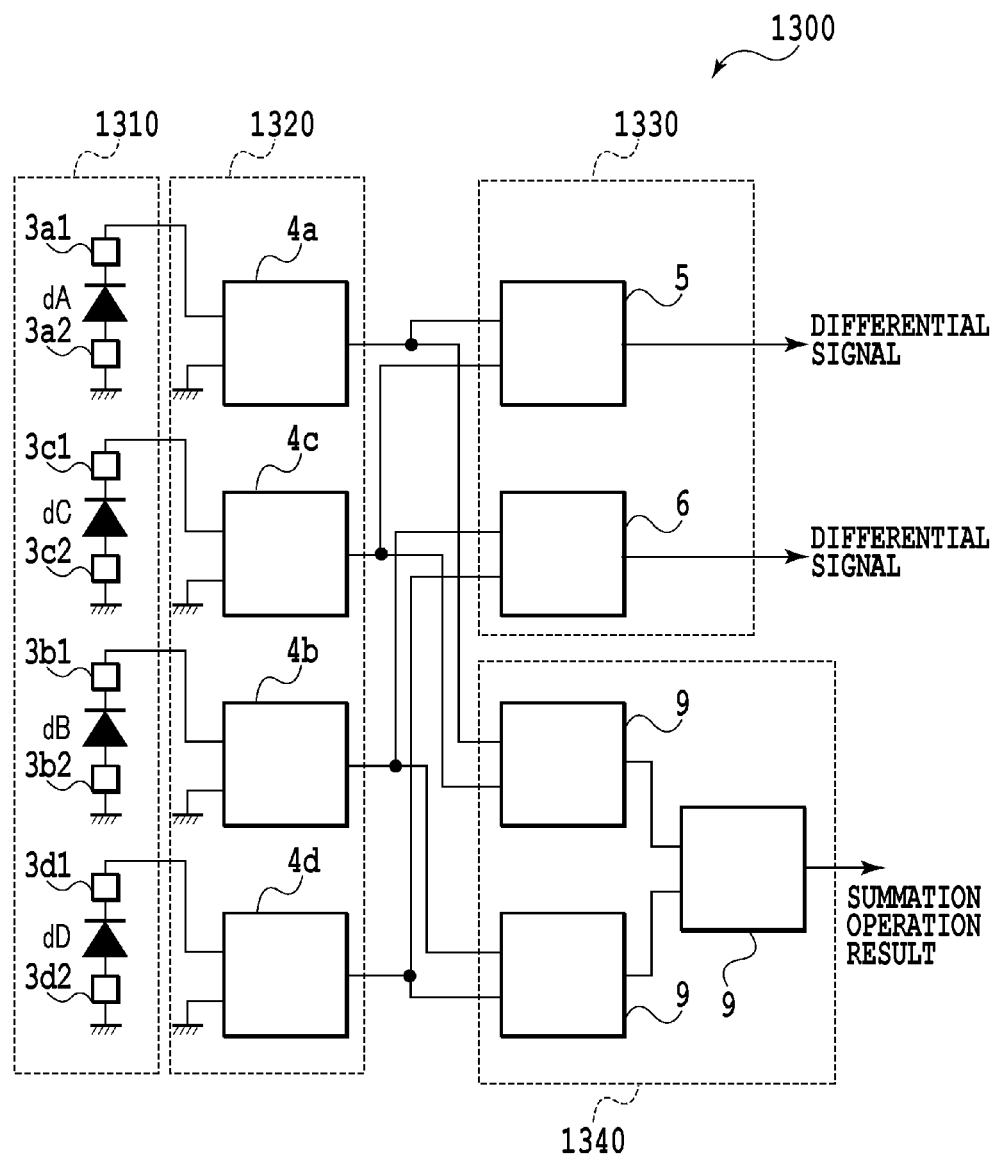
FIG. 13 shows a configuration of a conventional light receiving device which calculates a difference value and a sum of outputs output from a light sensor.

FIG. 12 shows a relationship of a difference between $Ip_A$ and $Ip_B$ and a relationship of a total sum of $Ip_A$ to $Ip_D$ with respect to the position of the light source 505 (center axis of the opening part was set to 0 mm), when the light source 505 was moved against the position detection device 500 fabricated as described above. From the waveform of the difference shown in FIG. 12, it is understood that the position of the light source 505 and the difference between $Ip_A$ and $Ip_B$ have a correlation with each other. By using this correlation, it becomes possible to detect at what position the light source 505 exists in the viewing angle range. Further, it is also understood from the waveform of the difference shown in FIG. 12 that noise is small and a high S/N ratio is obtained.

Further, from the total sum signal of $Ip_A$ to $Ip_D$ shown in FIG. 12, it can be determined whether or not the light source 505 comes close to the position detection device 500. From the result of this determination, even when the difference signal is zero, it is determined whether or not the light source 505 comes close to the position detection device 500 (or whether or not the light source 505 enters the viewing field range of the position detection device 500), and this is effective in many applications.

Here, the light source may be supposed to be a finger or the like of a human body. In this case, preferably InSb or InAsSb is used as the material of the detection part.

The invention claimed is:

1. A light receiving device comprising a circuit pattern including a first light receiving part, a second light receiving part, a first output terminal, and a second output terminal, which are formed on a same substrate, each of the first light receiving part and the second light receiving part having:
    a semiconductor layered part forming a PN or PIN junction photodiode structure having a first conductivity type semiconductor layer and a second conductivity type semiconductor layer;
    a first electrode connected to the first conductivity type semiconductor layer; and a second electrode connected to the second conductivity type semiconductor layer, wherein the first electrode of the first light receiving part is connected to the first electrode of the second light receiving part, the second electrode of the first light receiving part is connected to the first output terminal, the second electrode of the second light receiving part is connected to the second output terminal, and wherein a difference between signals generated in the first light receiving part and the second light receiving part is output between the first output terminal and the second output terminal.

2. The light receiving device according to claim 1 further comprising a third light receiving part, a fourth light receiving part, a third output terminal, and a fourth output terminal, which are formed on the same substrate, each of the third light receiving part and the fourth light receiving part having:

a semiconductor layered part forming a PN or PIN junction photodiode structure having a first conductivity type semiconductor layer and a second conductivity type semiconductor layer;

a first electrode connected to the first conductivity type semiconductor layer; and a second electrode connected to the second conductivity type semiconductor layer, wherein the second electrode of the third light receiving part and the second electrode of the fourth light receiving part are connected to the first electrodes of the first light receiving part and the second light receiving part, the first electrode of the third light receiving part is connected to the third output terminal, and the first electrode of the fourth light receiving part is connected to the fourth output terminal.

3. The light receiving device according to claim 1, further comprising current-voltage conversion amplifiers connected to the first output terminal and the second output terminal, respectively.

4. The light receiving device according to claim 2 further comprising:

a first subtraction circuit connected to the first output terminal and the second output terminal;

a second subtraction circuit connected to the third output terminal and the fourth output terminal;

a third subtraction circuit connected to the first output terminal and the third output terminal;

a fourth subtraction circuit connected to the second output terminal and the fourth output terminal; and an addition circuit connected to output terminals of the third subtraction circuit and the fourth subtraction circuit.

5. The light receiving device according to claim 4, wherein the output terminals and the subtraction circuits are connected to each other via the current-voltage conversion amplifiers, respectively.

6. The light receiving device according to claim 4, wherein the output terminals and the subtraction circuits are connected to each other without via switching elements, respectively.

7. The light receiving device according to claim 1 comprising the two circuit patterns on the same substrate, further comprising:

a first interconnection layer connecting the first electrode of the first light receiving part and the first electrode of the second light receiving part to each other in one of the circuit patterns; and a second interconnection layer connecting the first electrode of the first light receiving part and the first electrode of the second light receiving part to each other in the other one of the circuit patterns, wherein the first interconnection layer and the second interconnection layer are formed so as to cross each other in a crossing part, a first conductivity type semiconductor layer is formed on the substrate in the crossing part, and, in the crossing part, the first interconnection layer is formed on the first conductivity type semiconductor layer in the crossing part via an insulating layer and the second interconnection layer is connected electrically to the first conductivity type semiconductor layer in the crossing part via a contact hole formed in a part of the insulating layer.

8. The light receiving device according to claim 1, wherein the semiconductor layered part is formed of a material containing indium and/or antimony.

9. A position detection device, comprising:

the light receiving device according to claim 1; and a viewing angle restrictor controlling an incident direction of light entering the light receiving part of the light receiving device.

* * * * *